United States Patent
Howitt et al.

(10) Patent No.: US 12,416,459 B2
(45) Date of Patent: Sep. 16, 2025

(54) MODULAR HEATSINK AND METHODS OF USE THEREOF

(71) Applicant: GM GLOBAL TECHNOLOGY OPERATIONS LLC, Detroit, MI (US)

(72) Inventors: Timothy James Howitt, Oxford, MI (US); Ronald Miller, Bloomfield Hills, MI (US); Erin Farbar, LaSalle (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 117 days.

(21) Appl. No.: 18/534,309

(22) Filed: Dec. 8, 2023

(65) Prior Publication Data

US 2025/0189244 A1 Jun. 12, 2025

(51) Int. Cl.
*F28F 9/26* (2006.01)
(52) U.S. Cl.
CPC .......... *F28F 9/262* (2013.01); *F28F 2275/14* (2013.01); *F28F 2280/105* (2013.01)
(58) Field of Classification Search
CPC ... F28F 9/262; F28F 2275/14; F28F 2280/105
See application file for complete search history.

(56) References Cited

U.S. PATENT DOCUMENTS

| 999,334 A * | 8/1911 | Pearson | E02D 5/04 |
| | | | 405/281 |
| 3,421,578 A * | 1/1969 | Marton | H01F 27/085 |
| | | | 257/722 |
| 6,053,666 A * | 4/2000 | Irvine | E02D 5/02 |
| | | | 405/281 |
| 7,612,992 B2 * | 11/2009 | Chen | G06F 1/20 |
| | | | 438/106 |
| 2008/0302509 A1 * | 12/2008 | Chen | H01L 23/4006 |
| | | | 165/80.3 |
| 2011/0286179 A1 * | 11/2011 | Motschman | H01L 23/4093 |
| | | | 361/679.54 |
| 2012/0314430 A1 * | 12/2012 | McCanless | F21V 29/713 |
| | | | 165/185 |

(Continued)

FOREIGN PATENT DOCUMENTS

| DE | 855415 B | 11/1952 |
| DE | 112019001566 B4 | 4/2022 |
| KR | 1020120001301 A | 4/2012 |

*Primary Examiner* — Devon Lane
(74) *Attorney, Agent, or Firm* — Ingrassia Fisher & Lorenz, LLP | IF&L

(57) ABSTRACT

Heatsinks and methods are provided for dissipating thermal energy from a substrate in thermal contact therewith. The heatsinks include a plurality of sequentially coupled links. Each of the links includes a hub portion elongated along a central longitudinal axis thereof, a male connector on a first side of the hub portion and elongated along the central longitudinal axis, a female connector on a second side of the hub portion and elongated along the central longitudinal axis, wherein the female connector of each of the links is configured to couple with the male connector of an adjacent one of the links, a planar contact portion on a third side of the hub portion configured to receive thermal energy via conduction from the substrate, and a fin extending from a fourth side of the hub portion configured to dissipate the thermal energy to a surrounding environment via convection.

20 Claims, 8 Drawing Sheets

(56) References Cited

U.S. PATENT DOCUMENTS

| | | | |
|---|---|---|---|
| 2013/0082407 A1* | 4/2013 | Abbott | H01L 21/561 |
| | | | 257/E23.116 |
| 2013/0328466 A1 | 12/2013 | Chang | |
| 2014/0182828 A1* | 7/2014 | Lekhin | F28F 1/422 |
| | | | 165/179 |
| 2021/0059068 A1* | 2/2021 | Tsunoda | H01L 23/467 |
| 2022/0026961 A1* | 1/2022 | Jeffers | G06F 1/206 |
| 2023/0204301 A1* | 6/2023 | Mao | F28D 15/0241 |
| | | | 165/104.26 |

* cited by examiner

MODULAR HEATSINK AND METHODS OF USE THEREOF

INTRODUCTION

The technical field generally relates to heatsinks, and more particularly relates to a flexible, modular heatsink configured to contour to substrates having various shapes and sizes.

Heatsinks and similar heat exchangers typically include a solid body having a contact surface and a plurality of fins extending from the contact surface. The heatsink may be disposed such that the contact surface is in thermal contact with a heat source or substrate. In this arrangement, thermal energy may be transferred from the heat source, to the heatsink through the contact surface, and dissipated to a surrounding environment through the fins. Typically, the contact surfaces of heatsinks are formed to have curvatures specific to an intended application to maximize the thermal transfer from the heat source to the heatsink. As such, each specific application may require production of a corresponding heatsink resulting in an increase in manufacturing costs.

Accordingly, it is desirable to provide heatsinks capable of use with various substrates having different structures. Furthermore, other desirable features and characteristics of the present disclosure will become apparent from the subsequent detailed description and the appended claims, taken in conjunction with the accompanying drawings and the foregoing introduction.

SUMMARY

A heatsink is provided for dissipating thermal energy from a substrate in thermal contact therewith. In one example, the heatsink includes a plurality of sequentially coupled links. Each of the plurality of sequentially coupled links includes a hub portion elongated along a central longitudinal axis thereof, a male connector on a first side of the hub portion and elongated along the central longitudinal axis, a female connector on a second side of the hub portion and elongated along the central longitudinal axis, wherein the female connector of each of the plurality of sequentially coupled links is configured to couple with the male connector of an adjacent one of the plurality of sequentially coupled links, a planar contact portion on a third side of the hub portion configured to receive thermal energy via conduction from the substrate, and a fin extending from a fourth side of the hub portion configured to dissipate the thermal energy to a surrounding environment via convection.

In various examples, the male connector of the heatsink may include a protruding portion extending from the hub portion and a rounded pin disposed on a distal end of the protruding portion, the female connector includes a barrel socket having a first opening along a distal side thereof defined between a pair of edges and a second opening on an end thereof, and the barrel socket of each of the plurality of sequentially coupled links is configured to slidably receive an end of the rounded pin of the adjacent one of the plurality of sequentially coupled links through the second opening to dispose the rounded pin within the barrel socket and the protruding portion extending through the first opening. In various examples, the first opening of each of the plurality of sequentially coupled links has a dimension measured between the pair of edges that is smaller than a diameter of the rounded pin such that the rounded pin of the adjacent one of the plurality of sequentially coupled links is restricted from passing through the first opening.

In various examples, the male connector and the female connector are configured such that when the male connector of a first link of the plurality of sequentially coupled links is coupled with the female connector of a second link of the plurality of sequentially coupled links and the planar contact portion of each of the first link and the second link are aligned. A gap is provided between the protruding portion of the first link and a first of the pair of edges of the second link that is sufficient to provide for pivoting of the male connector in a first rotational direction until the protruding portion of the first link contacts the first edge of the second link. In various examples, the male connector and the female connector are configured such that when the male connector of the first link is coupled with the female connector of the second link and the planar contact portion of each of the first link and the second link are aligned, a gap is provided between the protruding portion of the first link and a second of the pair of edges of the second link that is sufficient to provide for pivoting of the male connector in a second rotational direction until the protruding portion of the first link contacts the second edge of the second link.

In various examples, the female connector of each of the plurality of sequentially coupled links is configured to provide for pivoting of the male connector of the adjacent one of the plurality of sequentially coupled links coupled thereto about an axis parallel to the central longitudinal axis of the hub portion.

In various examples, each of the plurality of sequentially coupled links includes a curved portion on the hub portion extending along the longitudinal axis that is configured to promote convective thermal energy transfer therefrom.

In various examples, the fin of a first of the plurality of sequentially coupled links extends from the hub portion by a first dimension, the fin of a second of the plurality of sequentially coupled links extends from the hub portion by a second dimension, and the first dimension is less than the second dimension.

In various examples, the heatsink includes a finless link that consists of a hub portion elongated along a central longitudinal axis thereof, a male connector on a first side of the hub portion and elongated along the central longitudinal axis that is configured to couple with the female connector of an adjacent first link of the plurality of sequentially coupled links, a female connector on a second side of the hub portion and elongated along the central longitudinal axis that is configured to couple with the male connector of an adjacent second link of the plurality of sequentially coupled links, and a contact portion on a third side of the hub portion.

In various examples, the heatsink includes an extension link that includes a male connector member elongated along a longitudinal axis thereof that is configured to couple with the female connector of a first link of the plurality of sequentially coupled links, a female connector member elongated along a longitudinal axis thereof that is configured to couple with the male connector of a second link of the plurality of sequentially coupled links, and an elongated tether configured to secure the male connector member and the female connector member to each other, wherein the elongated tether is configured to adjust a dimension between the male connector member and the female connector member.

A method is provided for dissipating thermal energy from a substrate. In one example, the method includes assembling a heatsink by sequentially coupling a plurality of links, wherein each of the plurality of links include a hub portion elongated along a central longitudinal axis thereof, a male connector on a first side of the hub portion and elongated along the central longitudinal axis, a female connector on a second side of the hub portion and elongated along the central longitudinal axis, a planar contact portion on a third side of the hub portion, and a fin extending from a fourth side of the hub portion, wherein sequentially coupling the plurality of links includes coupling the female connector of one or more of the plurality of links with the male connector of one or more corresponding links of the plurality of links adjacent thereto, disposing the heatsink in thermal contact with a surface of the substrate such that thermal energy is transferred from the surface to the planar contact portion of each of the plurality of links via conduction, and dissipating the thermal energy transferred to the planar contact portion from the fin of each of the plurality of links to a surrounding environment via convection.

In various examples, the male connector may include a protruding portion extending from the hub portion and a rounded pin disposed on a distal end of the protruding portion, the female connector includes a barrel socket having a first opening along a distal side thereof defined between a pair of edges and a second opening on an end thereof, and assembling the heatsink includes slidably inserting an end of the rounded pin of a first link of the plurality of links through the second opening of a second link of the plurality of links to dispose the rounded pin of the first link within the barrel socket of the second link and the protruding portion of the first link extending through the first opening of the second link, wherein the first opening of the second link has a dimension measured between the pair of edges that is smaller than a diameter of the rounded pin of the first link such that the rounded pin of the first link is restricted from passing through the first opening of the second link.

In various examples, the method may include positioning the male connector of the first link and the female connector of the second link coupled thereto in an initial position wherein the planar contact portion of each of the first link and the second link are aligned, wherein a first gap is provided between the protruding portion of the first link and a first of the pair of edges of the second link while in the initial position, and pivoting the male connector from the initial position in a first rotational direction until the protruding portion of the first link contacts the first edge of the second link.

In various examples, the method may include positioning the male connector of the first link and the female connector of the second link coupled thereto in the initial position, wherein a second gap is provided between the protruding portion of the first link and a second of the pair of edges of the second link while in the initial position, and pivoting the male connector from the initial position in a second rotational direction until the protruding portion of the first link contacts the second edge of the second link.

In various examples, the method may include pivoting the male connector of a first link of the plurality of links about an axis parallel to the central longitudinal axis of the hub portion while the male connector of the first link is coupled to the female connector of a second of the plurality of links.

In various examples, each of the plurality of links includes a curved portion on the hub portion extending along the longitudinal axis, and the method includes dissipating thermal energy from the curved portion via convection.

In various examples, the fin of a first link of the plurality of links extends from the hub portion by a first dimension, the fin of a second of the plurality of links extends from the hub portion by a second dimension, and the first dimension is less than the second dimension, wherein disposing the heatsink in thermal contact with the surface of the substrate includes positioning the heatsink such that the first link is disposed over a concave surface.

In various examples, the method may include coupling a finless link with a first link of the plurality of links, wherein the finless link consists of a hub portion elongated along a central longitudinal axis thereof, a male connector on a first side of the hub portion and elongated along the central longitudinal axis, a female connector on a second side of the hub portion and elongated along the central longitudinal axis, and a contact portion on a third side of the hub portion, wherein coupling the finless link with the first link includes coupling male connector of the finless link to the female connector of the first link or coupling the female connector of the finless link to the male connector of the first link.

In various examples, the method may include coupling an extension link with a first link and a second link of the plurality of links, wherein the extension link includes a male connector member elongated along a longitudinal axis thereof, a female connector member elongated along a longitudinal axis thereof, and an elongated tether. In such examples, coupling the extension link to the first link and the second link includes coupling the male connector member of the extension link to the female connector of the first link, coupling the female connector member of the extension link to the male connector of the second link, and coupling the male connector member and the female connector member of the extension link to each other with the elongated tether.

In various examples, the method may include securing the heatsink to the substrate with an adhesive, an adhesive tape, or a fastener.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding introduction or the following detailed description.

Figure 1:
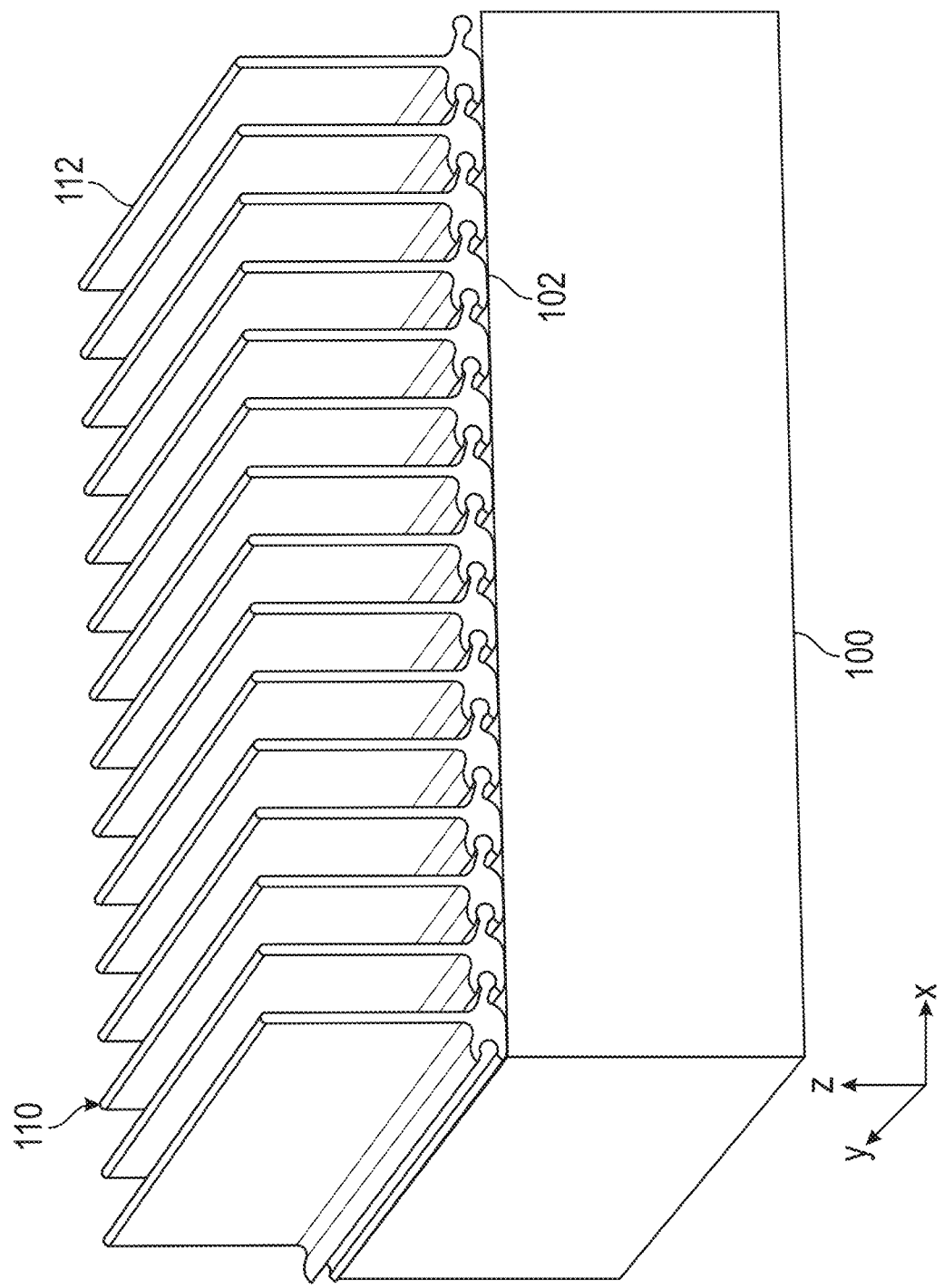
FIG. 1 is a perspective view of a heatsink disposed on a first substrate in accordance with an example.
Figure 2:
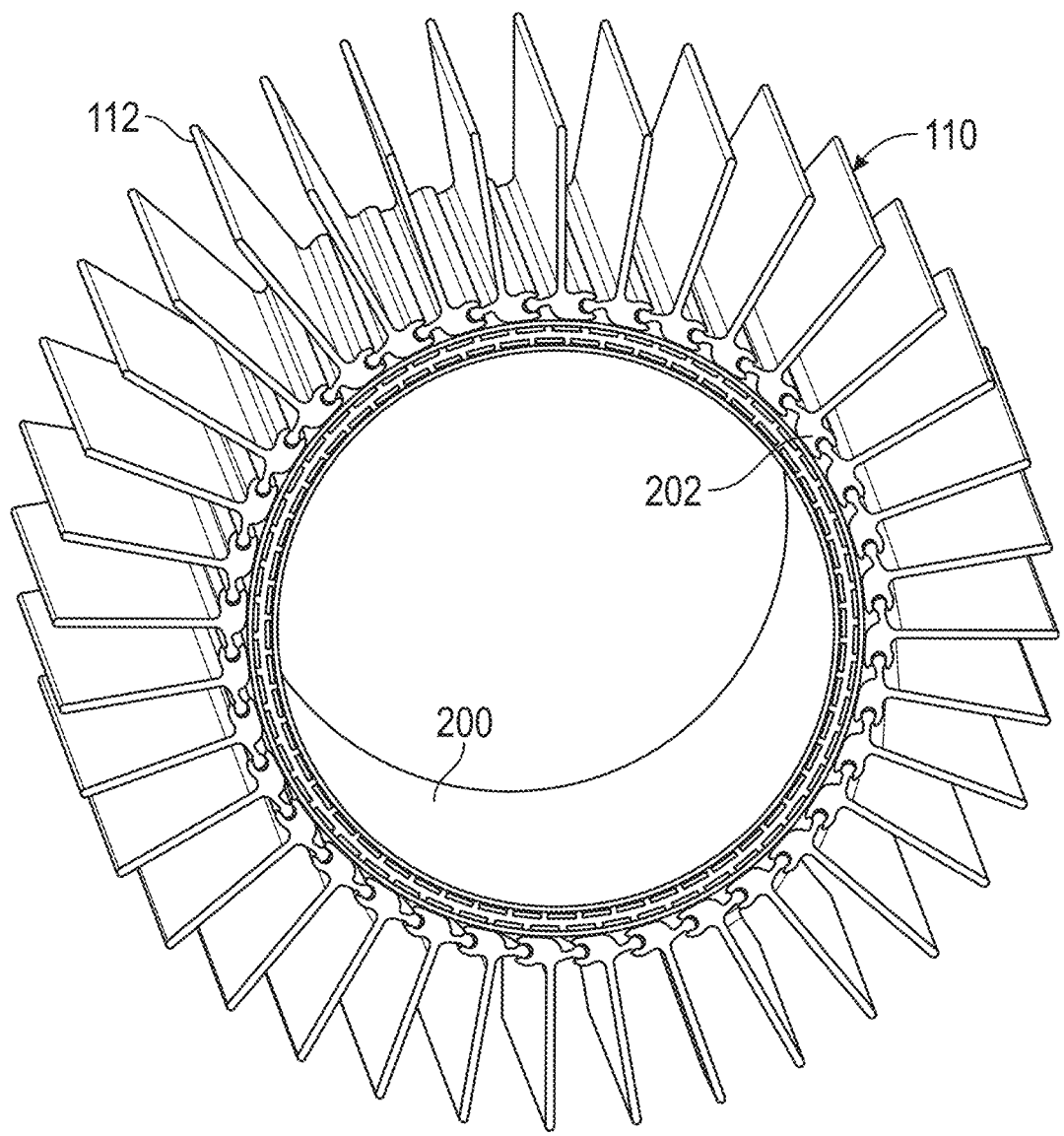
FIG. 2 is a perspective view of the heatsink of FIG. 1 disposed on a second substrate in accordance with an example.
Figure 3:
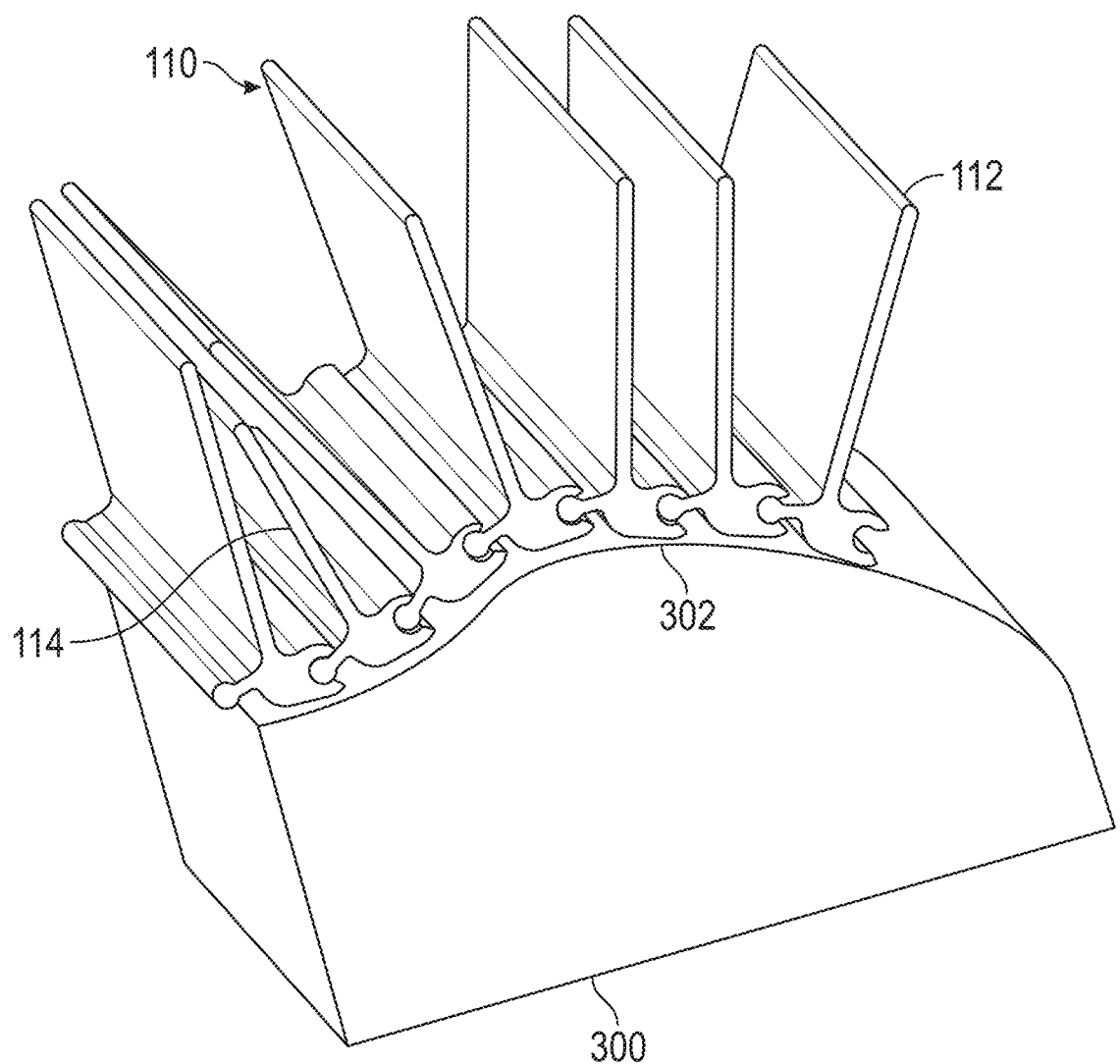
FIG. 3 is a perspective view of the heatsink of FIGS. 1 and 2 disposed on a third substrate in accordance with an example.

FIGS. 1-3 illustrate aspects of an exemplary heatsink 110 configured to dissipate thermal energy from a heat source or substrate. The heatsink 110 has a flexible, modular structure that includes a plurality of links sequentially coupled together to define an assembly. The flexibility of the assembly provides for the heatsink 110 to contoured to substrates of various shapes, and the modular construction allows for easy adjustment to the length of the heatsink 110 to accommodate substrates of various sizes. Although the heatsink 110 may include individual links of various shapes and sizes, in some examples the heatsink 110 may be formed entirely or predominately of identical links. In this manner, the heatsink 110 may be used to dissipate thermal energy from various substrates without a need for manufacturing custom shaped heatsinks. The heatsink 110 may be used to dissipate heat from surfaces of various substrates. The substrates may include planar surfaces, concave surfaces, convex surfaces, complex shaped surfaces, surfaces having edges (e.g., around a corner), circular surfaces (e.g., pipes), etc.

FIG. 1 presents the heatsink 110 as including a chain of exemplary links 112 assembled and in contact with a planar surface 102 of a first substrate 100. For convenience, the heatsink 110 will be described herein in reference to a three-axis coordinate system (x, y, z) as represented in FIG. 1; however, the heatsink 110 is not necessarily limited by the coordinate system. Similarly, FIG. 2 presents the heatsink 110 in contact with a cylindrical surface 202 of a second substrate 200, and FIG. 3 presents the heatsink 110 in contact with a curved surface 302 of a third substrate 300. In the examples of FIGS. 2 and 3, the heatsink 110 is entirely formed of identical links 112 and still capable of directly contacting the surfaces 102 and 202 with each of the links 112 despite the variations in contour of the surfaces 102, 202, and 302. The flexibility of the heatsink 110 is due to each of the links 112 being configured to be pivotable about the y-axis relative to adjacent links 112 in both positive and negative directions of rotation. In FIG. 3, the heatsink 110 includes all identical links 112 with a single exception of a shortened link 114. The shortened link 114 is the same as the links 112 except that the shortened link 114 extends a shorted dimension from the curved surface 302 to accommodate a concave area of the curved surface 302.

Figure 4:
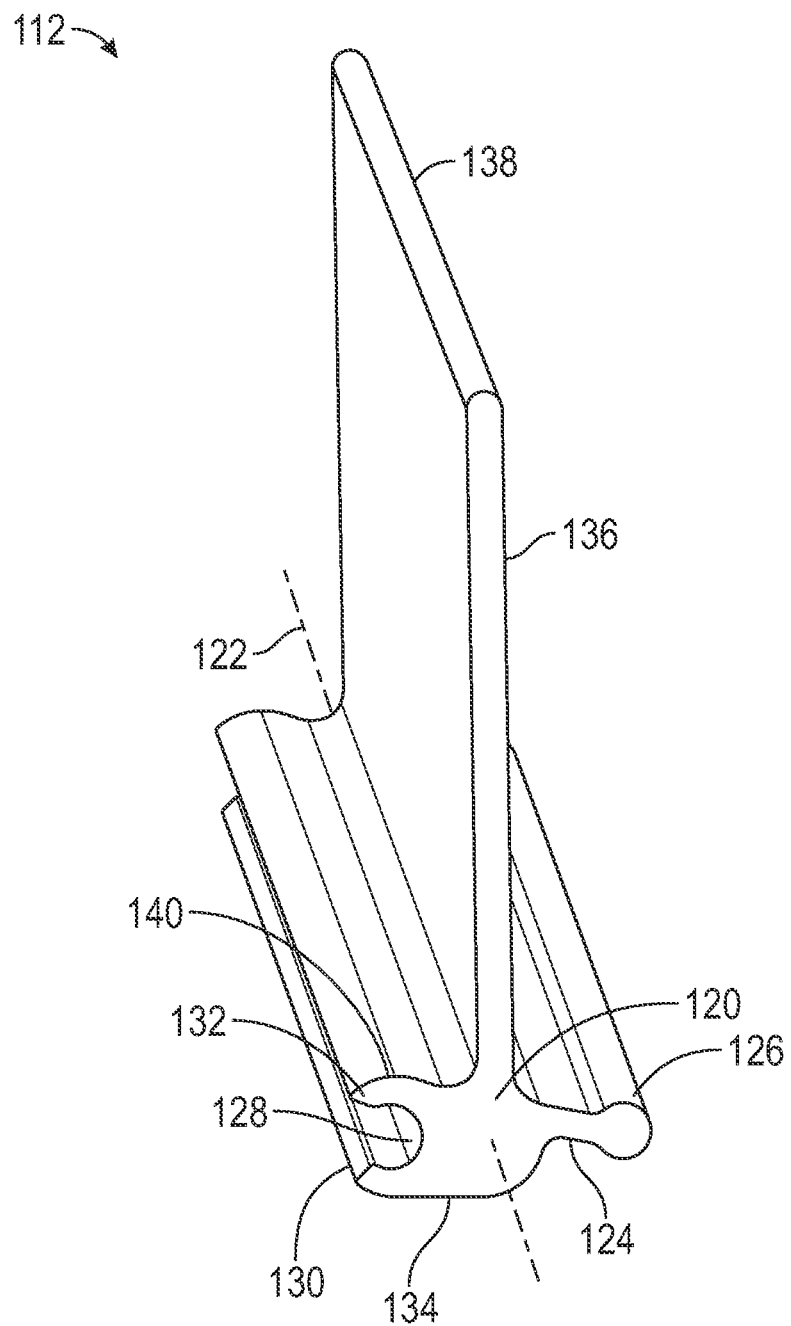
FIG. 4 is a perspective view of a first exemplary link for the heatsink of FIGS. 1-3 in accordance with an example.

FIG. 4 presents an isolated, perspective view of one of the exemplary links 112. The link 112 includes a hub portion 120 elongated along a central longitudinal axis 122 thereof. A male connector is disposed on a first side of the hub portion 120 and elongated along the central longitudinal axis 122. A female connector is disposed on a second side of the hub portion 120, generally oppositely disposed the first side, and elongated along the central longitudinal axis 122. A planar contact portion 134 is disposed on a third side of the hub portion 120 between the first and second sides. A fin 136 radially extends from a fourth side of the hub portion 120, generally oppositely disposed from the third side, and terminates at a distal end 138.

In various examples, the male connector and the female connector of each of the links are configured to couple with a corresponding female connector and male connector, respectively, of adjacent links (e.g., additional links 112). With this structure, the links 112 may be chained together to form the assembly. The male and female connectors may have various structures. In the example of FIG. 4, the male connector includes a protruding portion 124 extending from the hub portion 120 and a rounded pin 126 disposed on a distal end of the protruding portion 124. The female connector includes a barrel socket 128 having a side opening along a longitudinal side thereof defined between a pair of edges, referred to herein as a first edge 130 and a second edge 132, and distal openings on opposite ends of the barrel socket 128.

During assembly of the heatsink 110, the male and female connectors of each of the links 112 may be coupled by inserting an end of the rounded pin 126 of a first link 112 into one of the distal openings at an end of the barrel socket 128 of a second link 112 with the protruding portion 124 of the first link 112 extending through the side opening of the second link 112. The rounded pin 126 of the first link 112 may be slid into the barrel socket 128 of the second link 112 until, for example, the first and second links 112 are aligned in a direction perpendicular to the longitudinal axes 122 of the first and second links 112 (e.g., aligned along the x-axis). Notably, a diameter of the rounded pin 126 of the first link 112 is larger than a dimension of the side opening of the second link 112 as measured between the first edge 130 and the second edge 132. Therefore, the first and second links 112 are both restricted from relative movement in the direction perpendicular to the longitudinal axes 122 of the first and second links 112 (e.g., aligned along the x-axis). The assembly may be lengthened along the x-axis using the above described process by coupling the male connector of a third link 112 to the female connector of the first link 112, the female connector of a fourth link 112 to the male connector of the second link 112, and so on.

In various examples, adjacent pairs of the links 112 are coupled in a manner that provides for pivoting of the adjacent links 112 relative to each other. With the exemplary structure of the link 112 presented in FIG. 4, the female connector is configured to allow the rounded pin 126 to pivot within the barrel socket 128 when coupled. This is due to the dimension of the side opening of the barrel socket 128 as measured between the first edge 130 and the second edge 132 being greater than a thickness of the protruding portion 124 as measured along the z-axis. For example, when the first and second links 112 are coupled, the joint formed therebetween may be considered to be in a neutral or null position while the planar contact portions 134 thereof are aligned as presented in FIG. 1. In this neutral or null position, a gap may be provided between exterior surfaces of the protruding portion 124 of the first link 112 and the first edge 130, the second edge 132, and/or both the first edge 130 and the second edge 132 of the second link 112.

With a gap provided between the protruding portion 124 and the first edge 130, the rounded pin 126 is capable of rotating about a central longitudinal axis of the rounded pin 126 in a rotational or radial direction toward the planar contact portion 134 of the second link 112 until contact occurs between the protruding portion 124 and the first edge 130. For example, FIG. 2 presents adjacent links 112 of the heatsink 110 as pivoted at least partially towards the planar contact portions 134 of adjacent links 112. With a gap provided between the protruding portion 124 and the second edge 132, the rounded pin 126 is capable of rotating about a central longitudinal axis of the rounded pin 126 in a rotational or radial direction toward the fin 136 of the second link 112 until contact occurs between the protruding portion 124 and the second edge 132. For example, FIG. 3 presents adjacent links 112 of the heatsink 110 as pivoted at least partially towards the fins 136 of adjacent links 112 over the concave portion of the surface 302.

In some examples, the adjacent links 112 may be configured to rotate relative to each other from the neutral or null position by about 1 to 20 degrees toward the planar contact portion 134 and by about 1 to 14 degrees toward the fin 136. In some examples, the first edge 130 and/or the second edge 132 may be angled such that planar surfaces thereof are parallel with surfaces of the protruding portion 124 when contact occurs therebetween.

Either during assembly or subsequent thereto, the planar contact portions 134 of the plurality of links 112 may be placed directly in physical contact with the substrate (e.g., the substrate 100, 200, or 300) or otherwise placed in thermal contact with the substrate (e.g., having a thermally conductive adhesive or tape therebetween). Once assembled and secured to the substrate, the planar contact portions 134 of the heatsink 110 in combination define a contact surface configured to receive thermal energy via conduction from the substrate.

The thermal energy received by the heatsink 110 through the planar contact portions 134 or other surfaces of the links 112 may be dissipated to a surrounding environment, for example, via convention from the fins 136. In some examples, the heatsink 110 may include a curved portion 140 on a side of the hub portion 120 and/or on the female connector between the barrel socket 128 and the fin 136 that is configured to promote thermal energy transfer by convection. This functionality may be due, at least in part, to the additional surface area provided by the curved portion 140 relative to planar surfaces.

The heatsink 110 may include individual links of various shapes and sizes in addition to or as alternatives to the exemplary links 112 of FIG. 4. As one example, the shortened link 114 of FIG. 3 has substantially the same structure as the links 112 of FIG. 4 except that the fin 136 of the shortened link 114 is shorter, that is, the fin 136 of the shortened link 114 extends from the hub portion 120 thereof to the distal end 138 thereof by a first dimension, the fin 136 of the link 112 of FIG. 3 extends from the hub portion 120 thereof to the distal end 138 thereof by a second dimension, and the first dimension is less than the second dimension.

Figure 5:
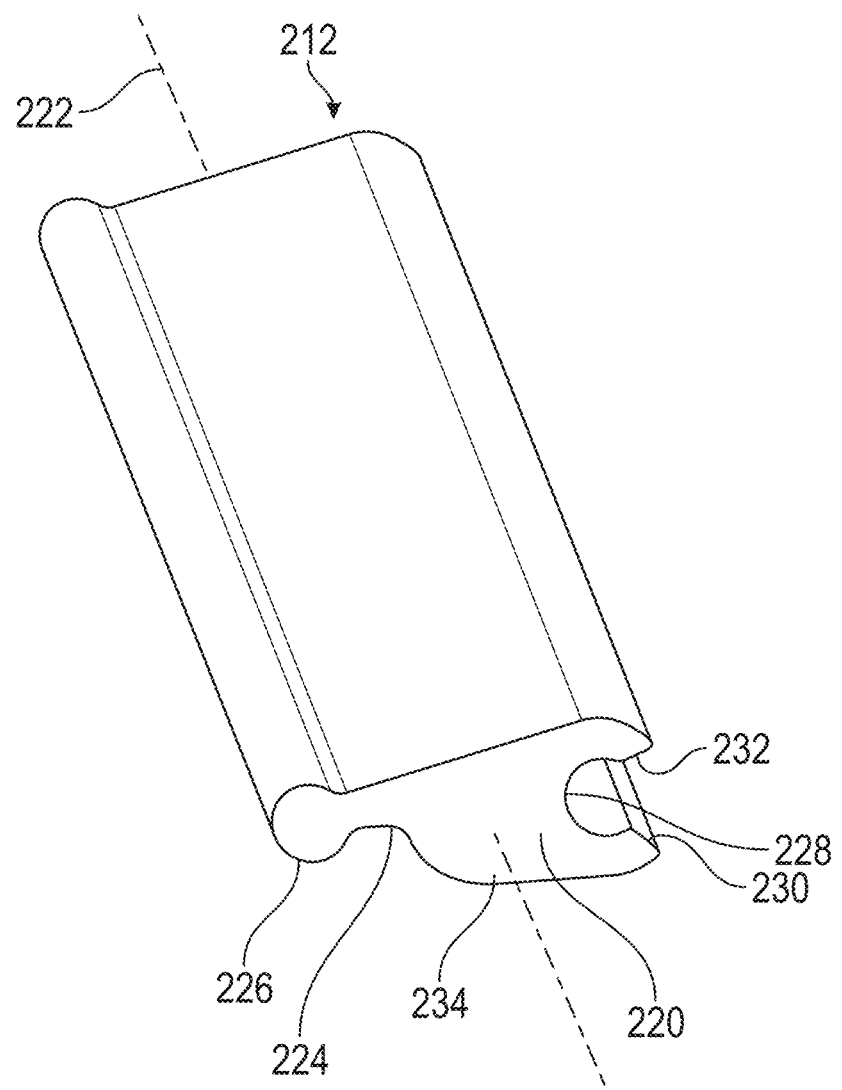
FIG. 5 is a perspective view of a second exemplary link for the heatsink of FIGS. 1-3 in accordance with an example.

FIG. 5 presents a finless link 212 having a structure similar to the aforementioned links 112 and 114 but with the fin 136 omitted. The finless link 212 includes a hub portion 220 elongated along a central longitudinal axis 222 thereof. A male connector is disposed on a first side of the hub portion 220 and elongated along the central longitudinal axis 222. A female connector is disposed on a second side of the hub portion 220, generally oppositely disposed the first side, and elongated along the central longitudinal axis 222. A planar contact portion 234 is disposed on a third side of the hub portion 220 between the first and second sides.

In various examples, the male connector and the female connector of each of the links are configured to couple with a corresponding female connector and male connector, respectively, of adjacent links (e.g., the links 112 or 114). The male and female connectors may have various structures. In the example of FIG. 5, the male connector includes a protruding portion 224 extending from the hub portion 220 and a rounded pin 226 disposed on a distal end of the protruding portion 224. The female connector includes a barrel socket 228 having a side opening along a longitudinal side thereof defined between a pair of edges, referred to herein as a first edge 230 and a second edge 232, and distal openings on opposite ends of the barrel socket 228.

Figure 6:
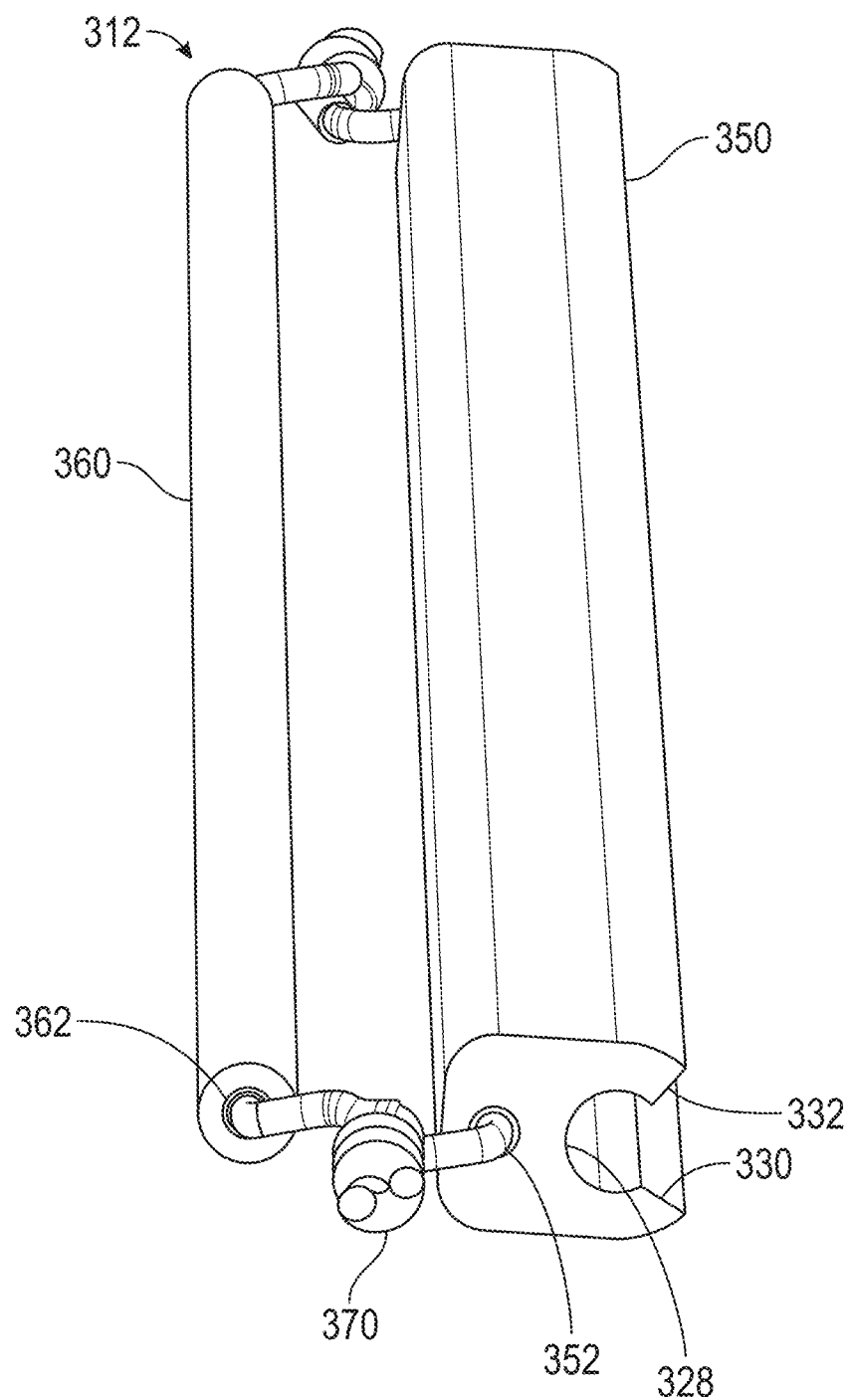
FIG. 6 is a perspective view of a third exemplary link for the heatsink of FIGS. 1-3 in accordance with an example.
Figure 7:
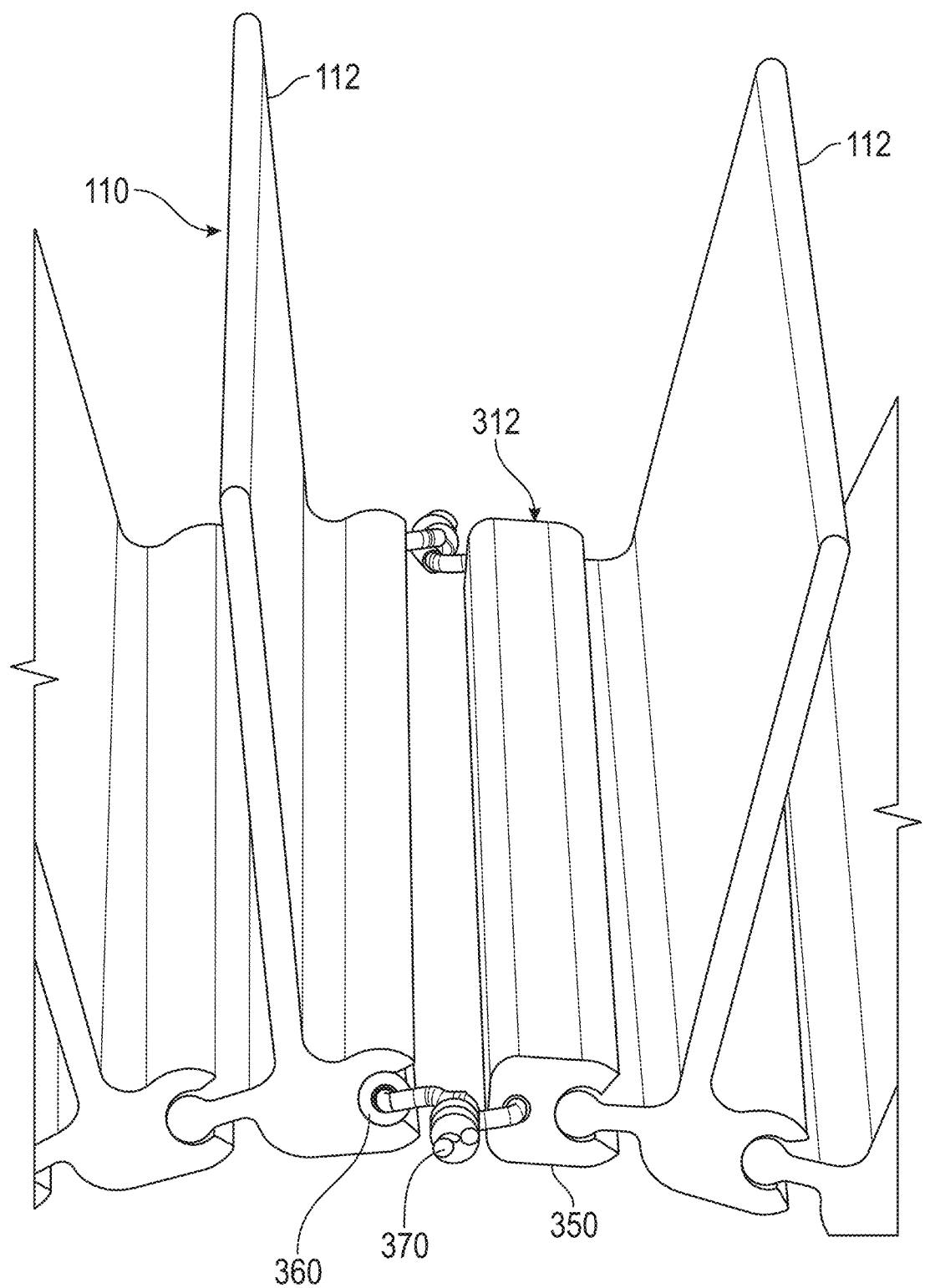
FIG. 7 is a perspective view illustrating a method of coupling a pair of the first exemplary links of FIG. 4 with the third exemplary link of FIG. 6 in accordance with an example.

FIGS. 6 and 7 present an extension link 312 that may be used to adjust a length of the heatsink 110. The extension link 312 includes a female connector member 350 and a male connector member 360 coupled to each other by at least one elongated tether 370. The female connector member 350 has a body that is elongated along a longitudinal axis thereof and the male connector member 360 has a body that is elongated along a longitudinal axis thereof.

In various examples, the female connector member 350 and the male connector member 360 are configured to couple with a corresponding male connector and female connector, respectively, of adjacent links (e.g., the links 112, 114, or 212). The female connector member 350 and the male connector member 360 may have various structures. In the example of FIGS. 6 and 7, the female connector member 350 includes a barrel socket 328 having a side opening along a longitudinal side thereof defined between a pair of edges, referred to herein as a first edge 330 and a second edge 332, and distal openings on opposite ends of the barrel socket 328. The male connector member 360 includes a rounded pin shaped body.

The tether 370 may couple the female connector member 350 and the male connector member 360 in various manners. For example, the tether 370 may include one or more elongated bodies securing the female connector member 350 and the male connector member 360 at ends thereof and/or at any point along the longitudinal sides thereof. In the example of FIGS. 6 and 7, the female connector member 350 and the male connector member 360 include through holes 352 and 362, respectively, extending therethrough parallel to longitudinal axes thereof. The tether 370 is configured to be received through both of the through holes 352 and 362 and secured at one or both ends of the female connector member 350 and the male connector member 360 to form a loop retaining the female connector member 350 and the male connector member 360 together.

The elongated tether 370 is configured to adjust a dimension between the male connector member and the female connector member. For example, the tether 370 may have various lengths, that is, longer to provide more space between the female connector member 350 and the male connector member 360 or shorter to reduce the space between the female connector member 350 and the male connector member 360. Alternatively, the tether 370 may include a mechanism (not shown) for adjusting the length thereof. In one example, the tether 370 may include a pair of wire, a first of the wires received through the through hole 352 of the female connector member 350 and a second of the wires received through the through hole 362 of the male connector member 360. Ends of the wires may be coupled, for example, twisted, to secure the female connector member 350 and the male connector member 360 to each other.

FIG. 7 illustrates a method of securing ends of the heatsink 110 about a substrate, such as the second substrate 200 with the extension link 312. More specifically, the female connector member 350 of the extension link 312 is coupled to a male connector of a first of the links 112 of the assembly, and the male connector member 360 of the extension link 312 is coupled to a female connector of a last of the links 112 of the assembly. By providing the capability of adjusting the spacing between the female connector member 350 and the male connector member 360 of the extension link 312, the heatsink 110 may be fit to substrates having dimensions that do not correspond to a multiple of the widths of the links included in the heatsink 110 (e.g., links 112, 114, 212, and/or 312).

The links of the heatsink 110, such as the links 112, 114, 212, 312, or other types of links, may be formed of various thermally conductive materials, such as various metallic materials and composite materials. The individual links of the heatsink 110 may be formed of the same materials or different materials. In various examples, one or more of the links may be formed of or include a steel, aluminum, aluminum alloy, copper, or copper alloy.

Various manufacturing processes may be used to produce the individual links of the heatsink 110. Nonlimiting examples include certain extrusion processes and wire burning processes (also known as electro discharge machining (EDM) and spark machining).

Once assembled, the links of the heatsink 110 may be secured with a conductive adhesive (e.g., between the planar contact portions 134/234/334 and the substrate, within the joints defined by the male and female connectors, or both), secured with a conductive adhesive tape between the planar contact portions 134/234/334 and the substrate, and/or secured with one or more fasteners (e.g., fasteners through one or more of the links into the substrate). In various examples, one or more of the links may include one or more through holes (not shown) each configured to receive a corresponding fastener therethrough to secure the heatsink 110 to a substrate.

Figure 8:
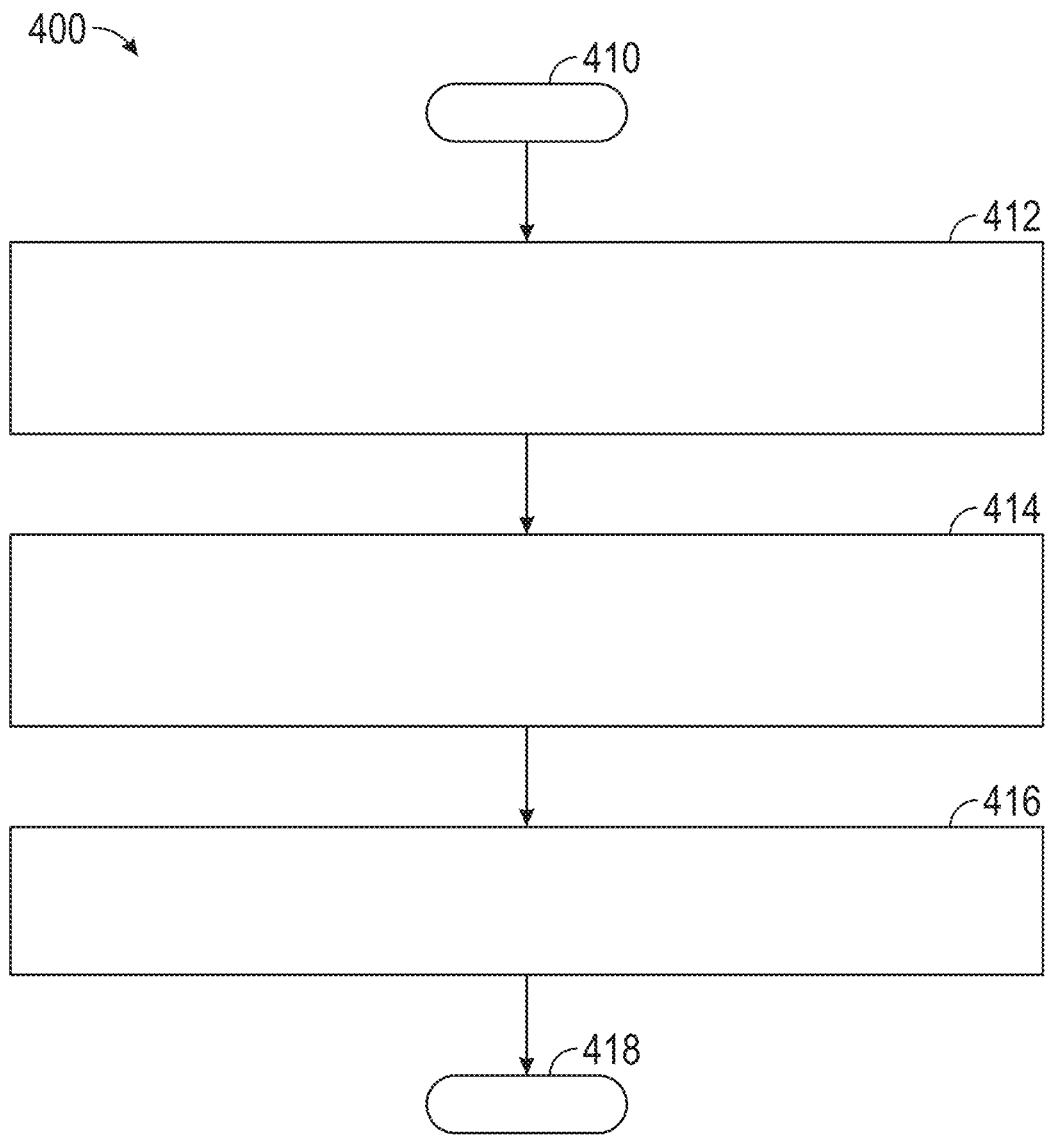
FIG. 8 is a flowchart illustrating a method of dissipating thermal energy from a surface of a substrate in accordance with an example.

With reference now to FIG. 8 and with continued reference to FIGS. 1-7, a flowchart provides a method 400 for dissipating thermal energy from a surface of a substrate as performed by the heatsink 110, in accordance with various examples. As may be appreciated in light of the disclosure, the order of operation within the method 400 is not limited to the sequential execution as illustrated in FIG. 8, but may be performed in one or more varying orders as applicable and in accordance with the present disclosure.

In one example, the method 400 may start at 410.

At 412, the method 400 may include assembling the heatsink 110 by sequentially coupling a plurality of links (e.g., links 112, 114, 212, and/or 312) by coupling the female connector of one or more of the plurality of links with the male connector of one or more corresponding links of the plurality of links adjacent thereto. In some examples, assembling the heatsink 110 includes slidably inserting an end of the rounded pin 126 of a first link of the plurality of links through the second opening of a second link of the plurality of links to dispose the rounded pin 126 of the first link within the barrel socket 128 of the second link and the protruding portion 124 of the first link extending through the first opening of the second link, wherein the first opening of the second link has a dimension measured between the pair of edges that is smaller than a diameter of the rounded pin 126 of the first link such that the rounded pin 126 of the first link is restricted from passing through the first opening of the second link.

At 414, the method 400 may include disposing the heatsink 110 in thermal contact with the surface of the substrate such that thermal energy is transferred from the surface to the planar contact portion 134 of each of the plurality of links via conduction. In some examples, the method 400 may include pivoting the male connector of one or more of the plurality of links relative to the female connector coupled thereto to contour the heatsink 110 to the curvature of the surface of the substrate.

At 416, the method 400 may include dissipating the thermal energy transferred to the planar contact portion 134 from the fin 136 of each of the plurality of links to a surrounding environment via convection.

In some examples, the method 400 may include securing the heatsink 110 to the substrate with an adhesive, an adhesive tape, or a fastener.

The method 400 may end at 418.

The systems and methods disclosed herein provide various benefits over certain existing systems and methods. For example, the flexibility of the assembly provides for the heatsink 110 to be contoured to substrates of various shapes, and the modular construction allows for easy adjustment to the length of the heatsink 110 to accommodate substrates of various sizes without the need to manufacture custom shaped heatsinks.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes may be made in the function and arrangement of elements without departing from the scope of the disclosure as set forth in the appended claims and the legal equivalents thereof.

What is claimed is:

1. A heatsink for dissipating thermal energy from a substrate in thermal contact therewith, the heatsink comprising:
    a plurality of sequentially coupled links, each of the plurality of sequentially coupled links including:
        a hub portion elongated along a central longitudinal axis thereof;
        a male connector on a first side of the hub portion and elongated along a male connector axis that is parallel to the central longitudinal axis;
        a female connector on a second side of the hub portion and elongated along a female connector axis that is parallel to the central longitudinal axis, wherein the female connector of each of the plurality of sequentially coupled links is configured to couple with the male connector of an adjacent one of the plurality of sequentially coupled links;
        a planar contact portion on a third side of the hub portion configured to receive thermal energy via conduction from the substrate; and
        a fin extending from a fourth side of the hub portion configured to dissipate the thermal energy to a surrounding environment via convection; and
    an extension link that includes:
        a male connector member elongated along a longitudinal axis thereof that is configured to couple with the female connector of a first link of the plurality of sequentially coupled links;
        a female connector member elongated along a longitudinal axis thereof that is configured to couple with the male connector of a second link of the plurality of sequentially coupled links; and
        an elongated tether configured to secure the male connector member and the female connector member to each other, wherein the elongated tether is configured to adjust a dimension between the male connector member and the female connector member.

2. The heatsink of claim 1, wherein the male connector includes a protruding portion extending from the hub portion and a rounded pin disposed on a distal end of the protruding portion, the female connector includes a barrel socket having a first opening along a distal side thereof defined between a pair of edges and a second opening on an end thereof, and the barrel socket of each of the plurality of sequentially coupled links is configured to slidably receive an end of the rounded pin of the adjacent one of the plurality of sequentially coupled links through the second opening to dispose the rounded pin within the barrel socket and the protruding portion extending through the first opening.

3. The heatsink of claim 2, wherein the first opening of each of the plurality of sequentially coupled links has a dimension measured between the pair of edges that is smaller than a diameter of the rounded pin such that the rounded pin of the adjacent one of the plurality of sequentially coupled links is restricted from passing through the first opening.

4. The heatsink of claim 2, wherein the male connector and the female connector are configured such that when the male connector of a third link of the plurality of sequentially coupled links is coupled with the female connector of a fourth link of the plurality of sequentially coupled links and the planar contact portion of each of the third link and the fourth link are aligned, a gap is provided between the protruding portion of the third link and a first edge of the pair of edges of the fourth link that is sufficient to provide for pivoting of the male connector in a first rotational direction until the protruding portion of the third link contacts the first edge of the fourth link.

5. The heatsink of claim 4, wherein the male connector and the female connector are configured such that when the male connector of the third link is coupled with the female connector of the fourth link and the planar contact portion of each of the third link and the fourth link are aligned, a gap is provided between the protruding portion of the third link and a second edge of the pair of edges of the fourth link that is sufficient to provide for pivoting of the male connector in a second rotational direction until the protruding portion of the third link contacts the second edge of the fourth link.

6. The heatsink of claim 1, wherein the female connector of each of the plurality of sequentially coupled links is configured to provide for pivoting of the male connector of the adjacent one of the plurality of sequentially coupled links coupled thereto about an axis parallel to the central longitudinal axis of the hub portion.

7. The heatsink of claim 1, wherein each of the plurality of sequentially coupled links includes a curved portion on the hub portion extending along the central longitudinal axis that is configured to promote convective thermal energy transfer therefrom.

8. The heatsink of claim 1, wherein the fin of a first of the plurality of sequentially coupled links extends from the hub portion by a first dimension, the fin of a second of the plurality of sequentially coupled links extends from the hub portion by a second dimension, and the first dimension is less than the second dimension.

9. A heatsink for dissipating thermal energy from a substrate in thermal contact therewith, the heatsink comprising:
  a plurality of sequentially coupled links, each of the plurality of sequentially coupled links including:
    a hub portion elongated along a central longitudinal axis thereof;
    a male connector on a first side of the hub portion and elongated along a male connector axis that is parallel to the central longitudinal axis;
    a female connector on a second side of the hub portion and elongated along a female connector axis that is parallel to the central longitudinal axis, wherein the female connector of each of the plurality of sequentially coupled links is configured to couple with the male connector of an adjacent one of the plurality of sequentially coupled links;
    a planar contact portion on a third side of the hub portion configured to receive thermal energy via conduction from the substrate; and
    a fin extending from a fourth side of the hub portion configured to dissipate the thermal energy to a surrounding environment via convection; and
  a finless link that consists of:
    a second hub portion elongated along a second central longitudinal axis thereof;
    a second male connector on a first side of the second hub portion and elongated along a second male connector axis that is parallel to the second central longitudinal axis that is configured to couple with the female connector of an adjacent first link of the plurality of sequentially coupled links;
    a second female connector on a second side of the second hub portion and elongated along a second female connector axis that is parallel to the second central longitudinal axis that is configured to couple with the male connector of an adjacent second link of the plurality of sequentially coupled links; and
    a second contact portion on a third side of the second hub portion.

10. The heatsink of claim 1, wherein the plurality of sequentially coupled links form an assembly configured to be secured to the substrate such that the planar contact portion of each of the plurality of sequentially coupled links directly contact surfaces of the substrate that are concave, convex, rounded, or combinations thereof.

11. A method of dissipating thermal energy from a substrate, comprising:
  assembling a heatsink by sequentially coupling a plurality of links, wherein each of the plurality of links include a hub portion elongated along a central longitudinal axis thereof, a male connector on a first side of the hub portion and elongated along the central longitudinal axis, a female connector on a second side of the hub portion and elongated along the central longitudinal axis, a planar contact portion on a third side of the hub portion, and a fin extending from a fourth side of the hub portion, wherein sequentially coupling the plurality of links includes coupling the female connector of one or more of the plurality of links with the male connector of one or more corresponding links of the plurality of links adjacent thereto;
  coupling an extension link with a first link and a second link of the plurality of links, wherein the extension link includes a male connector member elongated along a longitudinal axis thereof, a female connector member elongated along a longitudinal axis thereof, and an elongated tether, wherein coupling the extension link to the first link and the second link includes:
    coupling the male connector member of the extension link to the female connector of the first link;
    coupling the female connector member of the extension link to the male connector of the second link; and
    coupling the male connector member and the female connector member of the extension link to each other with the elongated tether;
  disposing the heatsink in thermal contact with a surface of the substrate such that thermal energy is transferred from the surface to the planar contact portion of each of the plurality of links via conduction; and
  dissipating the thermal energy transferred to the planar contact portion from the fin of each of the plurality of links to a surrounding environment via convection.

12. The method of claim 11, wherein the male connector includes a protruding portion extending from the hub portion and a rounded pin disposed on a distal end of the protruding portion, the female connector includes a barrel socket having a first opening along a distal side thereof defined between a pair of edges and a second opening on an end thereof, and assembling the heatsink includes slidably inserting an end of the rounded pin of a third link of the plurality of links through the second opening of a fourth link of the plurality of links to dispose the rounded pin of the third link within the barrel socket of the fourth link and the protruding portion of the third link extending through the first opening of the fourth link, wherein the first opening of the fourth link has a dimension measured between the pair of edges that is smaller than a diameter of the rounded pin of the third link such that the rounded pin of the third link is restricted from passing through the first opening of the fourth link.

13. The method of claim 12, further comprising:
positioning the male connector of the third link and the female connector of the fourth link coupled thereto in an initial position wherein the planar contact portion of each of the third link and the fourth link are aligned, wherein a first gap is provided between the protruding portion of the third link and a first edge of the pair of edges of the fourth link while in the initial position; and
pivoting the male connector from the initial position in a first rotational direction until the protruding portion of the third link contacts the first edge of the fourth link.

14. The method of claim 13, further comprising:
positioning the male connector of the third link and the female connector of the fourth link coupled thereto in the initial position, wherein a second gap is provided between the protruding portion of the third link and a second edge of the pair of edges of the fourth link while in the initial position; and
pivoting the male connector from the initial position in a second rotational direction until the protruding portion of the third link contacts the second edge of the fourth link.

15. The method of claim 11, further comprising pivoting the male connector of a third link of the plurality of links about an axis parallel to the central longitudinal axis of the hub portion while the male connector of the third link is coupled to the female connector of a second of the plurality of links.

16. The method of claim 11, wherein each of the plurality of links includes a curved portion on the hub portion extending along the central longitudinal axis, wherein the method includes dissipating thermal energy from the curved portion via convection.

17. The method of claim 11, wherein the fin of a third link of the plurality of links extends from the hub portion by a first dimension, the fin of a second of the plurality of links extends from the hub portion by a second dimension, and the first dimension is less than the second dimension, wherein disposing the heatsink in thermal contact with the surface of the substrate includes positioning the heatsink such that the third link is disposed over a concave surface.

18. The method of claim 11, further comprising coupling a finless link with a third link of the plurality of links, wherein the finless link consists of a hub portion elongated along a central longitudinal axis thereof, a male connector on a first side of the hub portion and elongated along the central longitudinal axis, a female connector on a second side of the hub portion and elongated along the central longitudinal axis, and a contact portion on a third side of the hub portion, wherein coupling the finless link with the third link includes coupling male connector of the finless link to the female connector of the third link or coupling the female connector of the finless link to the male connector of the third link.

19. The method of claim 11, further comprising securing the heatsink to the substrate with an adhesive, an adhesive tape, or a fastener.

20. The method of claim 11, wherein the plurality of sequentially coupled links form an assembly configured to be secured to the substrate such that the planar contact portion of each of the plurality of sequentially coupled links directly contact surfaces of the substrate that are concave, convex, rounded, or combinations thereof.

\* \* \* \* \*